(12) United States Patent
Sengoku et al.

(10) Patent No.: US 8,557,035 B2
(45) Date of Patent: Oct. 15, 2013

(54) COATING-FORMING LIQUID COMPOSITION AND COATING-FORMING METHOD THEREWITH

(75) Inventors: Yoichi Sengoku, Amagasaki (JP); Masami Tsutae, Amagasaki (JP); Kiyoto Tai, Amagasaki (JP); Keisuke Joko, Amagasaki (JP); Tsuyoshi Amatani, Amagasaki (JP)

(73) Assignee: Mec Company, Amagasaki-Shi, Hyogo (JP)

( * ) Notice: Subject to any disclaimer, the term of this patent is extended or adjusted under 35 U.S.C. 154(b) by 0 days.

(21) Appl. No.: 13/446,962

(22) Filed: Apr. 13, 2012

(65) Prior Publication Data

US 2012/0260821 A1    Oct. 18, 2012

(30) Foreign Application Priority Data

Apr. 18, 2011 (JP) ................................. 2011-092055

(51) Int. Cl.
| | |
|---|---|
| *C09J 9/00* | (2006.01) |
| *C23C 22/07* | (2006.01) |
| *C23C 22/52* | (2006.01) |
| *C23C 26/00* | (2006.01) |
| *C23C 18/16* | (2006.01) |
| *C23C 22/68* | (2006.01) |
| *C23F 1/18* | (2006.01) |
| *H05K 3/38* | (2006.01) |

(52) U.S. Cl.
USPC .................. 106/287.2; 106/14.12; 106/14.16

(58) Field of Classification Search
USPC .................................. 106/287.2, 14.12, 14.16
See application file for complete search history.

(56) References Cited

U.S. PATENT DOCUMENTS

| 6,596,640 | B1 * | 7/2003 | Fishcer et al. ................. 438/692 |
|---|---|---|---|
| 6,740,591 | B1 * | 5/2004 | Miller et al. .................... 438/692 |
| 7,087,188 | B2 * | 8/2006 | Cadien et al. .................. 252/79.1 |
| 7,232,514 | B2 * | 6/2007 | Liu et al. ........................ 205/668 |
| 2002/0048677 | A1 * | 4/2002 | Hanneman et al. .......... 428/411.1 |
| 2002/0177318 | A1 * | 11/2002 | Miller ............................. 438/689 |
| 2006/0169597 | A1 * | 8/2006 | Liu et al. ........................ 205/680 |

FOREIGN PATENT DOCUMENTS

JP        2008-045156 A1    2/2008

* cited by examiner

*Primary Examiner* — Anthony J Green
(74) *Attorney, Agent, or Firm* — Law Office of Katsuhiro Arai

(57) ABSTRACT

Provided are: a coating-forming liquid composition capable of forming a coating for bonding copper to a photosensitive resin, which includes an aqueous solution containing an azole having only nitrogen as ring hetero atom, an acid having a logarithm of the reciprocal of acid dissociation constant of 3 to 8 at 25° C., and a salt thereof, has a pH of more than 4 and not more than 7 at 25° C., and can stably form a coating for improving adhesion between copper and a photosensitive resin even when used continuously or repeatedly; and a method of forming a coating for bonding copper to a photosensitive resin, which comprises bringing the surface of the copper into contact with the coating-forming liquid composition to form the coating.

7 Claims, No Drawings

COATING-FORMING LIQUID COMPOSITION AND COATING-FORMING METHOD THEREWITH

BACKGROUND OF THE INVENTION

1. Field of the Invention

The invention relates to a coating-forming liquid composition capable of forming a coating for bonding copper to a photosensitive resin and to a coating-forming method using the composition.

2. Description of the Related Art

Physical polishing such as buffing and chemical polishing such as soft etching are generally used to pre-treat a copper surface, on which a resist will be formed, in a printed circuit board-manufacturing process including forming a plating resist or an etching resist on the cupper surface using a photosensitive resin (photoresist) and patterning the resist. These polishing processes aim not only to activate the copper surface but also to roughen the copper surface so that the adhesion to the photosensitive resin can be improved by an anchoring effect.

Unfortunately, there have been increasing cases where physical polishing or chemical polishing is difficult due to a reduction in the thickness of an insulating layer-carrying substrate itself or a reduction in the thickness of a copper layer itself on which a resist will be formed (a reduction in thickness due to the use of electroless plating or the like), so that there have been increasing cases where rust removal with dilute sulfuric acid is alternatively used to activate the surface of copper. In recent years, a problem has also occurred with the adhesion between the surface of copper and a patterned resist in the activation process with dilute sulfuric acid, due to a reduction in the line width or size of the pattern to be formed, so that a reduction in productivity is now taking place.

More specifically, a photosensitive resin layer formed on the surface of copper is exposed to light and then developed with a developer such as an aqueous sodium carbonate solution, and the developed pattern is used as a plating resist or an etching resist in the next process, but if the resist does not have reliable adhesion in the plating process or the etching process, the desired pattern shape cannot be obtained. In particular, an electroless-plated copper layer formed as a conductive layer on an insulating layer is thin and difficult to be polished. Therefore, it has been required to establish a technique capable of improving the adhesion between the surface of copper and a photosensitive resin without polishing.

Patent document 1 listed below proposes a copper surface treatment agent capable of improving the adhesion of a photosensitive resin even to a copper surface not capable of being polished physically or chemically, which comprises an aqueous solution containing a specific heterocyclic compound and having a pH of 4 or less. When the surface of copper is treated with this copper surface treatment agent, a coating containing the specific heterocyclic compound is formed on the surface of copper, and the surface of copper is bonded to the photosensitive resin with the coating interposed therebetween, so that reliable adhesion applicable to fine line patterns can be achieved. It should be noted that when the copper surface treatment agent disclosed in patent document 1 is used in a pretreatment before the formation of a plating resist, the exposed coating generally has to be removed using an acid liquid or the like after the formation of the plating resist and before electroplating.

PRIOR ART DOCUMENT

Patent Document

Patent Document 1: Japanese Unexamined Patent Publication No. 2008-45156

SUMMARY OF THE INVENTION

Problems to be Solved by the Invention

As a result of study, however, the inventors have found that when the copper surface treatment agent described in patent document 1 is used continuously or repeatedly, the thickness of the resulting coating increases with increasing concentration of copper ions in the treatment agent, so that the adhesion between the copper surface and the photosensitive resin decreases. As a result of study, the inventors have also found that when the copper surface treatment agent is used continuously or repeatedly, a plating treatment agent, an etching treatment agent, or the like becomes more likely to infiltrate under the resist, depending on the composition of the copper surface treatment agent, so that patterning becomes difficult to be performed in some cases. As a result of study, the inventors have further found that in some cases, the coating is difficult to be removed, depending on the composition of the copper surface treatment agent.

An object of the invention, which has been accomplished in view of the above circumstances, is to provide a coating-forming liquid composition that can stably form a coating capable of improving the adhesion between copper and a photosensitive resin even when used continuously or repeatedly, and to provide a coating-forming method using the liquid composition.

Means for Solving the Problems

The invention is directed to a coating-forming liquid composition capable of forming a coating for bonding copper to a photosensitive resin, which includes an aqueous solution containing an azole having only nitrogen as ring hetero atom, an acid having a logarithm of the reciprocal of acid dissociation constant of 3 to 8 at 25° C., and a salt thereof, and which has a pH of more than 4 and not more than 7 at 25° C.

The invention is also directed to a method of forming a coating for bonding copper to a photosensitive resin, which includes bringing the surface of the copper into contact with the coating-forming liquid composition of the invention to form the coating.

In the invention, "copper" may be a material made of copper or copper alloy. As used herein, the term "copper" refers to copper or copper alloy.

As used herein, the term "photosensitive resin" refers not only to unexposed photosensitive resin but also to resin that forms a patterned resist on the surface of copper after development.

Effect of the Invention

Even when used continuously or repeatedly, the liquid composition according to the invention can stably form a coating capable of improving adhesion between copper and a photosensitive resin.

DETAILED DESCRIPTION OF THE PREFERRED EMBODIMENTS

The coating-forming liquid composition of the invention, which is capable of forming a coating for bonding copper to a photosensitive resin, contains each component described below and has a pH of more than 4 and not more than 7 at 25° C. The coating can be formed on any copper layer such as a sputtered copper layer, a vapor-deposited copper layer, a plated copper layer (an electroless-plated copper layer or an electroplated copper layer), or a copper foil such as an electrolytic copper foil or a rolled copper foil. In particular, the invention is significantly effective for a thin copper layer, such as a copper layer with a thickness of 5 µm or less, specifically, a sputtered, vapor-deposited, or plated copper layer with a thickness of 1 µm or less, because adhesion between a photosensitive resin and such a copper layer, which is difficult to be polished physically or chemically, can be ensured according to the invention even without polishing (roughening).

The photosensitive resin, which is a resist material provided on the copper surface with the coating interposed therebetween, is also not restricted. For example, a photosensitive resin including an acrylic resin or a methacrylic resin may be used, and the resin may also be used in various forms such as liquids and dry films. Traditionally, it has been difficult to ensure adhesion between a copper surface and dry films finely formed, for example, with a thickness of 10 µm or more and a width (or diameter) of 30 µm or less. In particular, therefore, the invention is significantly effective for such dry films, because even adhesion between copper and such finely-formed resists can be ensured according to the invention.

The coating-forming liquid composition of the invention has a pH of more than 4 and not more than 7 at 25° C. Controlling the pH in this range enables stable formation of a coating with the ability to improve adhesion between copper and a photosensitive resin, even when the coating-forming liquid composition is used continuously or repeatedly. It is considered that if a treatment liquid with a pH of 4 or less is used continuously or repeatedly, dissolution of copper into the liquid can proceed, so that copper ions in the liquid can excessively increase to form a chelate with an azole, which may cause lamination of the coating with copper ions and thus cause formation of a thick coating (laminated coating). It is considered that if such a thick coating is formed, interfacial peeling may be more likely to occur between layers in the laminated coating, so that the adhesion between copper and the photosensitive resin may decrease, although the reason for that is not clear.

In addition, if the coating is thick, a plating treatment liquid such as a plating solution or a cleaner, or an acid treatment liquid such as an etching treatment liquid including an etching solution may be more likely to infiltrate into the coating under the resist, and a problem such as difficulty in removing the coating in a post process may occur. In an embodiment of the invention, the pH is controlled in the preferred range, so that the amount (thickness) of deposition of the coating can be kept in a proper range, which makes possible it to prevent the infiltration of an acid treatment liquid. In this case, the coating can also be easily removed, so that good adhesion of plating can be achieved particularly when the composition of the invention is used in a pretreatment before a plating resist is formed.

In order to more effectively suppress the dissolution of copper into the coating-forming liquid, the pH is preferably 4.2 or more, more preferably 4.5 or more. In order to prevent a reduction in the solubility of the azole in the coating-forming liquid composition, the pH is preferably 6.8 or less, more preferably 6.5 or less. From all of these viewpoints, the pH of the coating-forming liquid composition is more than 4 and not more than 7, preferably from 4.2 to 6.8, more preferably from 4.5 to 6.5. The pH can be controlled by the content of the azole and the acid described below. Hereinafter, the components of the coating-forming liquid composition of the invention will be described.

(Azole)

The azole used in the invention forms a main component of the coating, which serves as an adhesion layer for bonding copper to a photosensitive resin. In an embodiment of the invention, an azole having only nitrogen as ring hetero atom is used in view of the ability to form a coating. Examples include diazole compounds such as diazole and derivatives thereof; triazole compounds such as triazole and derivatives thereof; and tetrazole compounds such as tetrazole and derivatives thereof, one or more of which may be used. In view of the improvement of adhesion, triazole compounds and tetrazole compounds are preferred, and tetrazole compounds are more preferred. From the same point of view, an amino group-containing azole is preferred.

Diazole compounds include imidazole, benzimidazole, pyrazole, and benzopyrazole, and in view of the improvement of adhesion, benzimidazole is preferred.

Triazole compounds include triazole (1H-1,2,3-triazole and/or 1H-1,2,4-triazole), benzotriazole, and 3-amino-1,2,4-triazole. In view of the improvement of adhesion, 3-amino-1,2,4-triazole and 1H-1,2,4-triazole are preferred, and 3-amino-1,2,4-triazole is more preferred.

Tetrazole compounds include tetrazole (1H-tetrazole), 5-amino-1H-tetrazole, 1-methyl-5-aminotetrazole, 1-ethyl-5-aminotetrazole, α-benzyl-5-aminotetrazole, β-benzyl-5-aminotetrazole, and 1-(β-aminoethyl)tetrazole. In view of the improvement of adhesion, 5-amino-1H-tetrazole, 1-methyl-5-aminotetrazole, 1-ethyl-5-aminotetrazole, α-benzyl-5-aminotetrazole, β-benzyl-5-aminotetrazole, and 1-(β-aminoethyl)tetrazole are preferred, and 5-amino-1H-tetrazole, 1-methyl-5-aminotetrazole, and 1-ethyl-5-aminotetrazole are more preferred.

The content of the azole in the composition is preferably 0.01% by weight or more, more preferably 0.1% by weight or more, even more preferably 0.2% by weight or more, in order to improve of adhesion and to control the pH of the coating-forming liquid composition in the above range. The content of the azole in the composition is also preferably 10% by weight or less, more preferably 8% by weight or less, even more preferably 6% by weight or less, in order to prevent a reduction in the solubility of the azole in the coating-forming liquid composition and to control the pH of the coating-forming liquid composition in the above range. From all of these viewpoints, the azole content is preferably from 0.01 to 10% by weight, more preferably from 0.1 to 8% by weight, even more preferably from 0.2 to 6% by weight.

(Acid and Salt Thereof)

The acid and the salt thereof used in the invention serve as a pH adjuster to adjust the pH of the coating-forming liquid composition to more than 4 and not more than 7 and also serve as a buffer to suppress fluctuations in pH when the coating-forming liquid composition is used continuously or repeatedly. This makes it possible to keep the amount of deposition of the coating constant, so that the coating for improving the adhesion between copper and a photosensitive resin can be formed stably. In addition, even when the coating-forming liquid composition is used continuously or repeatedly, an acid treatment liquid can be prevented from infiltrating, and the coating can be removed easily. If there is no buffer component, the pH of the coating-forming liquid composition will fluctuate due to a liquid coming from the upstream process (such as an acid cleaning process) or due to concentration of the coating-forming liquid composition or other factors, so that it will be difficult to stably form the coating for improving the adhesion.

From the above point of view, the invention uses an acid having a logarithm of the reciprocal of acid dissociation constant of 3 to 8 at 25° C., and a salt thereof. In order to easily control the pH of the coating-forming liquid composition in the above range, the logarithm is preferably in the range of 3.5 to 7.5, more preferably in the range of 3.8 to 7.2. In this context, the "logarithm of the reciprocal of acid dissociation constant at 25° C." corresponds to $pK_a$ when a monobasic acid is used. When a dibasic acid is used, any one of the logarithm ($pK_{a1}$) of the reciprocal of first-stage acid dissociation constant and the logarithm ($pK_{a2}$) of the reciprocal of second-stage acid dissociation constant may be in the range of 3 to 8. The same applies to the case that a tribasic or polybasic acid is used. When a dibasic or polybasic acid is used, the salt to be added may be one or more selected from normal and acid salts thereof, depending on the desired pH or the required buffer capacity.

Examples of the acid having a logarithm of the reciprocal of acid dissociation constant of 3 to 8 at 25° C. include acetic acid ($pK_a$=4.8), phosphoric acid ($pK_{a2}$=7.2), citric acid ($pK_{a3}$=6.4), phthalic acid ($pK_{a2}$=5.4), and formic acid ($pK_a$=3.6), one or more of which may be used.

Examples of the salt of the acid include, but are not limited to, a potassium salt, a sodium salt, a magnesium salt, a calcium salt, and a lithium salt, one or more of which may be used. In view of the solubility in the coating-forming liquid composition and availability, a potassium salt, a sodium salt, and a magnesium salt are preferred. In view of the long-term storage stability of the coating-forming liquid composition, a magnesium salt is preferred.

In order to easily control the pH of the coating-forming liquid composition in the above range, at least one acid selected from acetic acid, phosphoric acid, citric acid, and phthalic acid, and a salt thereof are preferably used. More preferably, acetic acid is used in combination with an acetate.

In view of the control of the pH of the coating-forming liquid composition in the above range, the content of the acid in the composition is preferably from 0.01 to 10% by weight, more preferably from 0.05 to 5% by weight, even more preferably from 0.1 to 4% by weight.

The amount of the salt of the acid in the composition is preferably from 0.05 to 20 moles, more preferably from 0.1 to 10 moles, even more preferably from 0.5 to 5 moles, based on 1 mole of the acid, in order to control the pH of the coating-forming liquid composition in the above range and to suppress fluctuations in pH when the coating-forming liquid composition is used continuously or repeatedly.

(Other Components)

As long as the above effects of the invention are not impaired, the coating-forming liquid composition of the invention may contain any other component such as a nonionic surfactant, an anionic surfactant, a cationic surfactant, an ampholytic surfactant, or glycols such as glycol, glycol ether, or polyethylene glycol, or a derivative thereof. When any other component is added, the content is preferably from about 0.001 to about 1.0% by weight. It should be noted that in view of the improvement of the adhesion between a photosensitive resin and a copper surface not having undergone polishing (roughening), the content of halide ions is preferably less than 100 ppm, more preferably less than 10 ppm, even more preferably less than 1 ppm. Still more preferably, the liquid composition is substantially free of halide ions exclusive of inevitable halide ion impurities.

The coating-forming liquid composition of the invention can be easily prepared by dissolving each of the above components in water. The water is preferably water from which ionic substances and impurities have been removed, such as ion-exchanged water, pure water, or ultrapure water.

For example, a coating can be formed using the coating-forming liquid composition of the invention under the conditions described below.

First, the surface of copper is washed with an acid liquid such as an aqueous sulfuric acid solution. Subsequently, the coating-forming liquid composition is brought into contact with the surface of copper, so that a coating is formed on the surface of copper. In this process, the method of bringing into contact may be, but not limited to, an immersion treatment or a spray treatment. In order to form a uniform coating, an immersion treatment is preferred.

When an immersion treatment is used, the temperature of the coating-forming liquid composition is preferably from 10 to 50° C., more preferably from 20 to 40° C., in view of coating formability. From the same point of view, the immersion time is preferably from 5 to 120 seconds, more preferably from 15 to 90 seconds. In general, the immersion treatment is followed by a water washing process and a drying process.

When a spray treatment is used, the temperature of the coating-forming liquid composition is preferably from 10 to 50° C., more preferably from 20 to 40° C., in view of coating formability. From the same point of view, the treatment is preferably performed at a spray pressure of 0.01 to 0.3 MPa for a spray time of 5 to 120 seconds, more preferably at a spray pressure of 0.05 to 0.2 MPa for a spray time of 15 to 90 seconds. In general, the spray treatment is followed by a water washing process and a drying process.

The amount (thickness) of deposition of the coating formed using the coating-forming liquid composition of the invention can be analyzed, for example, using an FT-IR RAS method, namely, FT-IR (Fourier transform infrared spectroscopy) based on reflection-absorption method (RAS method). In this case, the amount (thickness) of deposition of the coating can be tracked from the peak absorbance showing the maximum absorption in the wavenumber range of 3,000 to 3,500 $cm^{-1}$, and controlled based on this absorbance. The amount of deposition of the coating can be controlled by the concentration of the azole in the coating-forming liquid composition, the pH of the coating-forming liquid composition, the temperature of the coating-forming liquid composition, the time for which the copper surface is brought into contact with the coating-forming liquid composition, or the like. Since the coating-forming liquid composition of the invention contains the specified acid and a salt thereof, the desired amount of deposition of the coating can be easily maintained by the buffer action even when the composition is used continuously or repeatedly.

The coating obtained using the coating-forming liquid composition of the invention can ensure the adhesion to the photosensitive resin of a plating resist, an etching resist, a solder resist, or the like. Particularly when a printed circuit board is manufactured by a semi-additive process, the coating-forming liquid composition of the invention is advantageously used in a pretreatment process before a plating resist is formed on a layer thinly formed of copper.

EXAMPLES

Next, some examples of the invention and some comparative examples will be described. It will be understood that the examples are not intended to limit the interpretation of the invention.

[Preparation of Fresh Liquid Compositions and Used Liquid Compositions]

Fresh coating-forming liquid compositions having the compositions shown in Tables 1 and 2, respectively (in which the balance was ion-exchanged water) were prepared to be subjected to tests. Besides the fresh liquid compositions, coating-forming liquid compositions having the compositions shown in Tables 1 and 2, respectively (in which the balance was ion-exchanged water) were prepared and used for immersion treatment (at 25° C. for 30 seconds) of a single-side copper-clad laminate with an area corresponding to 10 $m^2$/L. After the treatment, the used coating-forming liquid composition was subjected to tests. The single-side copper-clad laminate was used after a pretreatment including immersing it in an aqueous 10% by weight sulfuric acid solution at 25° C. for 20 seconds, then washing it with water, and drying it.

TABLE 1

|  | Composition | Content (wt %) | pH (25° C.) |
|---|---|---|---|
| Example 1 | 5-amino-1H-tetrazole | 1.0 | 5.2 |
|  | Sodium acetate | 5.0 (0.61 mol/L) |  |
|  | Acetic acid ($pK_a$ = 4.8) | 0.5 (0.08 mol/L) |  |
| Example 2 | 3-amino-1,2,4-triazole | 3.0 | 6.8 |
|  | Sodium dihydrogen phosphate | 0.5 (0.04 mol/L) |  |
|  | Phosphoric acid ($pK_{a2}$ = 7.2) | 0.1 (0.01 mol/L) |  |
| Example 3 | 1H-tetrazole | 0.01 | 4.4 |
|  | Potassium hydrogen phthalate | 0.09 (0.004 mol/L) |  |
|  | Phthalic acid ($pK_{a2}$ = 5.4) | 0.01 (0.001 mol/L) |  |
| Example 4 | 1H-1,2,4-triazole | 5.0 | 6.0 |
|  | Magnesium acetate | 9.5 (0.44 mol/L) |  |
|  | Acetic acid ($pK_a$ = 4.8) | 0.5 (0.08 mol/L) |  |
| Example 5 | 1-methyl-5-aminotetrazole | 1.0 | 4.1 |
|  | Sodium citrate | 5.0 (0.19 mol/L) |  |
|  | Citric acid ($pK_{a3}$ = 6.4) | 4.0 (0.21 mol/L) |  |
| Example 6 | Benzimidazole | 2.0 | 6.1 |
|  | Potassium acetate | 5.0 (0.51 mol/L) |  |
|  | Acetic acid ($pK_a$ = 4.8) | 0.5 (0.08 mol/L) |  |
| Example 7 | 5-amino-1H-tetrazole | 1.0 | 5.2 |
|  | Magnesium acetate | 5.0 (0.23 mol/L) |  |
|  | Acetic acid ($pK_a$ = 4.8) | 0.5 (0.08 mol/L) |  |

TABLE 2

|  | Composition | Content (wt %) | pH (25° C.) |
|---|---|---|---|
| Comparative Example 1 | 5-amino-1H-tetrazole | 2.0 | <1.0 |
|  | Sulfuric acid | 3.0 |  |
| Comparative Example 2 | Imidazole | 1.0 | 2.0 |
|  | Nitric acid | 3.0 | (adjusted with 28 |
|  | 3,5-dimethylpyrazole | 0.1 | wt % ammonia water) |
| Comparative Example 3 | 3-amino-1,2,4-triazole | 2.0 | 3.0 |
|  | Acetic acid | 1.0 | (adjusted with |
|  | Phosphoric acid | 3.0 | potassium hydroxide) |
| Comparative Example 4 | Benzotriazole | 0.5 | 4.0 |
|  | Sulfuric acid | 2.0 | (adjusted with |
|  | Boric acid | 1.0 | sodium hydroxide) |
| Comparative Example 5 | 5-amino-1H-tetrazole | 1.0 | 7.2 |
|  | Sodium acetate | 1.0 | (adjusted with sodium hydroxide) |
| Comparative Example 6 | 5-amino-1H-tetrazole | 2.0 | 5.0 |
|  | Sulfuric acid | 1.0 | (adjusted with sodium hydroxide) |
| Comparative Example 7 | Benzotriazole | 0.5 | 8.0 (adjusted with sodium hydroxide) |
| Comparative Example 8 | Sulfuric acid | 10.0 | <1.0 |

[Testing Method 1]

Adhesion between the surface of copper and a dry film was evaluated, in which a resist pattern of small-diameter dots was used, and spray pressure-induced peeling of dots during the development of the dry film was quantitatively measured. The evaluation method is described below.

A substrate having a 0.5 μm thick electroless-plated copper layer was provided as a test substrate, which was immersed in each coating-forming liquid composition (at 25° C. for 30 seconds), then washed with water, and dried. Subsequently, a dry film manufactured by Asahi Kasei Corporation (Sunfort SPG-102, 10 μm in thickness) was bonded to the copper surface of the test substrate, and exposed to light under the exposure condition of 150 mJ/cm$^2$ using a photomask having an exposure pattern with a dot/space ratio of 20 μmϕ/40 μm (the number of dots: 255). Subsequently, the film was developed by a spray treatment (at a spray pressure of 0.05 MPa for a spray time of 60 seconds) using an aqueous 1% by weight sodium carbonate solution (25° C.). After the development, the number of the remaining dots was counted, and the ratio of the remaining dots was calculated from the formula below. The results are shown in Tables 3 and 4. In the evaluation, the higher ratio of the remaining dots indicates the higher adhesion between the copper surface and the dry film.

The ratio (%) of the remaining dots=(the number of the remaining dots/255)×100

[Testing Method 2]

According to the invention, an acid liquid such as a plating treatment agent can be prevented from infiltrating under a resist. To demonstrate this effect, a dry film with the whole surface exposed to light was subjected to cross-cutting and then subjected to a hydrochloric acid immersion treatment, in which it was determined whether or not hydrochloric acid infiltrated between the copper surface and the dry film to cause lifting or peeling of the dry film. The evaluation method is described below.

A substrate having a 0.5 μm thick electroless-plated copper layer was provided as a test substrate, which was immersed in each coating-forming liquid composition (at 25° C. for 30 seconds), then washed with water, and dried. Subsequently, a dry film manufactured by Asahi Kasei Corporation (Sunfort SPG-102, 10 μm in thickness) was bonded to the copper surface of the test substrate, and the whole surface of the dry film was exposed to light under the exposure condition of 150 mJ/cm$^2$. Subsequently, the film was subjected to a spray treatment (at a spray pressure of 0.05 MPa for a spray time of 60 seconds) using an aqueous 1% by weight sodium carbonate solution (25° C.) In this test, patterned exposure was not performed, but the aqueous 1% by weight sodium carbonate solution treatment was performed for reproduction of a normal process history. Subsequently, a right angle lattice pattern (each 1 mm×1 mm) was cut (cross-cut) into the dry film using a cutter, and then the test substrate was subjected to an immersion treatment (at 25° C. for 10 minutes) using a hydrochloric acid solution with a hydrogen chloride concentration of 17.5% by weight. After washing with water and drying, the state of the test substrate was visually observed and evaluated according to the criteria below. The results are shown in Tables 3 and 4.

Evaluation Criteria

○: There was no abnormality.

Δ: Partial lifting or peeling of the resist occurred.

×: Entire lifting or peeling occurred.

[Testing Method 3]

According to the invention, the coating formed can be easily removed by acid cleaning or the like. To demonstrate this effect, coating removability was evaluated. The evaluation method is described below.

A substrate having a 0.5 μm thick electroless-plated copper layer was provided as a test substrate, which was immersed in each coating-forming liquid composition (at 25° C. for 30 seconds), then washed with water, and dried. Subsequently, the coating formed was brought into contact with an aqueous 10% by weight sulfuric acid solution (25° C.) for 30 seconds. An immersion treatment and a spray treatment (at a spray pressure of 0.05 MPa) were each used as the method of bringing into contact. Before and after the washing with sulfuric acid, the amount of deposition of the coating on the test substrate was analyzed by FT-IR RAS (Nicolet 380, manufactured by Thermo Fisher Scientific K.K.). The residual coating was detected based on the peak absorbance showing the maximum absorption in the wavenumber range of 3,000 to 3,500 cm$^{-1}$ (for example, the absorbance at 3,440 cm$^{-1}$ in the case of Example 1), and evaluated according to the criteria below. The results are shown in Tables 3 and 4. When the coating (0.009 in absorbance) formed by the treatment with the fresh liquid composition of Example 1 was quantified by a weight method, the amount of deposition of the coating was determined to be 0.02 g/m$^2$.

Evaluation Criteria

○: After the washing with sulfuric acid, there was no absorption.

Δ: After the washing with sulfuric acid, the measured absorbance was less than 1/10 of the absorbance before the washing with sulfuric acid.

×: After the washing with sulfuric acid, the measured absorbance was at least 1/10 of the absorbance before the washing with sulfuric acid.

TABLE 3

| | | Copper concentration (ppm) | pH (25° C.) | Results (testing method 1) Residual dot ratio (%) | Results (testing method 2) | Absorbance (before washing with sulfuric acid) | Results (testing method 3) Immersion | Spray |
|---|---|---|---|---|---|---|---|---|
| Example 1 | Fresh liquid | — | 5.2 | 98.3 | ○ | 0.009 | ○ | ○ |
| | Used liquid | 0.3 | 5.1 | 97.7 | ○ | 0.012 | ○ | ○ |
| Example 2 | Fresh liquid | — | 6.8 | 96.6 | ○ | 0.014 | ○ | ○ |
| | Used liquid | 0.1 | 5.9 | 97.0 | ○ | 0.017 | ○ | ○ |
| Example 3 | Fresh liquid | — | 4.4 | 93.5 | ○ | 0.007 | ○ | ○ |
| | Used liquid | 0.6 | 4.1 | 94.8 | ○ | 0.026 | Δ | ○ |
| Example 4 | Fresh liquid | — | 6.0 | 91.4 | ○ | 0.014 | ○ | ○ |
| | Used liquid | — | 6.0 | 92.5 | ○ | 0.019 | ○ | ○ |
| Example 5 | Fresh liquid | — | 4.1 | 98.1 | ○ | 0.013 | ○ | ○ |
| | Used liquid | 0.8 | 4.1 | 97.0 | ○ | 0.033 | Δ | ○ |

TABLE 3-continued

|  |  | Copper concentration (ppm) | pH (25° C.) | Results (testing method 1) Residual dot ratio (%) | Results (testing method 2) | Absorbance (before washing with sulfuric acid) | Results (testing method 3) Immersion | Spray |
|---|---|---|---|---|---|---|---|---|
| Example 6 | Fresh liquid | — | 6.1 | 87.1 | ○ | 0.018 | ○ | ○ |
|  | Used liquid | — | 5.9 | 82.4 | ○ | 0.015 | ○ | ○ |
| Example 7 | Fresh liquid | — | 5.2 | 98.9 | ○ | 0.012 | ○ | ○ |
|  | Used liquid | 0.2 | 5.1 | 98.4 | ○ | 0.017 | ○ | ○ |

The copper concentration was measured by an atomic absorption spectrophotometer (AA-6800F, manufactured by Shimadzu Corporation).
(In the copper concentration column, "—" means that the concentration was not able to be detected by the atomic absorption spectrophotometer.)

TABLE 4

|  |  | Copper concentration (ppm) | pH (25° C.) | Results (testing method 1) Residual dot ratio (%) | Results (testing method 2) | Absorbance (before washing with sulfuric acid) | Results (testing method 3) Immersion | Spray |
|---|---|---|---|---|---|---|---|---|
| Comparative Example 1 | Fresh liquid | — | <1.0 | 86.5 | ○ | 0.005 | ○ | ○ |
|  | Used liquid | 3860 | <1.0 | 51.9 | Δ | 0.067 | X | Δ |
| Comparative Example 2 | Fresh liquid | — | 2.0 | 77.6 | ○ | 0.004 | ○ | ○ |
|  | Used liquid | 325 | 1.7 | 35.5 | X | 0.048 | X | X |
| Comparative Example 3 | Fresh liquid | — | 3.0 | 90.6 | ○ | 0.010 | ○ | ○ |
|  | Used liquid | 97 | 2.3 | 67.2 | Δ | 0.039 | X | Δ |
| Comparative Example 4 | Fresh liquid | — | 4.0 | 83.7 | ○ | 0.018 | ○ | ○ |
|  | Used liquid | 29 | 2.7 | 72.9 | ○ | 0.037 | Δ | Δ |
| Comparative Example 5 | Fresh liquid | — | 7.2 | 95.4 | ○ | 0.034 | Δ | ○ |
|  | Used liquid | — | 7.1 | 95.3 | X | 0.042 | X | X |
| Comparative Example 6 | Fresh liquid | — | 5.0 | 93.3 | ○ | 0.013 | ○ | ○ |
|  | Used liquid | 28 | 2.9 | 71.4 | Δ | 0.026 | Δ | Δ |
| Comparative Example 7 | Fresh liquid | — | 8.0 | 82.9 | X | 0.045 | X | Δ |
|  | Used liquid | — | 7.4 | 86.2 | X | 0.041 | X | Δ |
| Comparative Example 8 | Fresh liquid | — | <1.0 | 21.0 | ○ | — | — | — |
|  | Used liquid | 3930 | <1.0 | 18.4 | ○ | — | — | — |

The copper concentration was measured by an atomic absorption spectrophotometer (AA-6800F, manufactured by Shimadzu Corporation).
(In the copper concentration column, "—" means that the concentration was not able to be detected by the atomic absorption spectrophotometer.)
In Comparative Example 8, an aqueous sulfuric acid solution was used in the treatment, in which no coating was formed, and therefore, the measurement of the absorbance and the evaluation of the testing method 3 were not performed.

As shown in Tables 3 and 4, the fresh liquid composition and the used liquid composition both provided good results with respect to all of the evaluation items in the examples according to the invention. On the other hand, the comparative examples were ranked lower than the examples particularly on the used liquid composition. From the results, it has been found that according to the invention, a coating capable of improving the adhesion between copper and a photosensitive resin can be stably formed even when the liquid composition is used continuously or repeatedly.

What is claimed is:

1. A coating-forming liquid composition capable of forming a coating for bonding copper to a photosensitive resin, which comprises an aqueous solution containing an azole having only nitrogen as ring hetero atom and an amino group, an acid having a logarithm of the reciprocal of acid dissociation constant of 3 to 8 at 25° C., and a salt of an acid having a logarithm of the reciprocal of acid dissociation constant of 3 to 8 at 25° C., and which has a pH of more than 4 and not more than 7 at 25° C.

2. The coating-forming liquid composition according to claim 1, wherein the content of the azole is from 0.01 to 10% by weight.

3. The coating-forming liquid composition according to claim 1, wherein the content of the acid is from 0.01 to 10% by weight, and the amount of the salt is from 0.05 to 20 moles based on 1 mole of the acid.

4. The coating-forming liquid composition according to claim 1, wherein the azole is at least one selected from a triazole compound and a tetrazole compound.

5. The coating-forming liquid composition according to claim 1, wherein the acid and the acid to form the salt are at least one selected from acetic acid, phosphoric acid, citric acid, and phthalic acid.

6. A method of forming a coating for bonding copper to a photosensitive resin, which comprises bringing a surface of the copper into contact with the coating-forming liquid composition according to claim 1 to form the coating.

7. The coating-forming liquid composition according to claim 1, wherein the aqueous solution consists essentially of the azole, the acid, and the salt.

* * * * *